(12) United States Patent
Vafin et al.

(10) Patent No.: US 9,819,358 B2
(45) Date of Patent: Nov. 14, 2017

(54) ENTROPY ENCODING BASED ON OBSERVED FREQUENCY

(75) Inventors: Renat Vafin, Tallinn (EE); Lazar Bivolarsky, Cupertino, CA (US); Mattias Nilsson, Sundbyberg (SE); Soren Vang Andersen, Luxembourg (LU)

(73) Assignee: Skype, Dublin (IE)

( * ) Notice: Subject to any disclaimer, the term of this patent is extended or adjusted under 35 U.S.C. 154(b) by 527 days.

(21) Appl. No.: 12/838,118

(22) Filed: Jul. 16, 2010

(65) Prior Publication Data

US 2011/0206131 A1 Aug. 25, 2011

Related U.S. Application Data

(60) Provisional application No. 61/306,381, filed on Feb. 19, 2010.

(51) Int. Cl.
*H03M 7/40* (2006.01)

(52) U.S. Cl.
CPC ........... *H03M 7/40* (2013.01); *H03M 7/4018* (2013.01)

(58) Field of Classification Search
CPC ..................................................... H03M 7/40
See application file for complete search history.

(56) References Cited

U.S. PATENT DOCUMENTS

| | | |
|---|---|---|
| 1,691,147 A | 11/1928 | Clark et al. |
| 4,833,535 A | 5/1989 | Ozeki et al. |
| 5,719,642 A | 2/1998 | Lee |
| 5,732,157 A | 3/1998 | Osawa |

(Continued)

FOREIGN PATENT DOCUMENTS

| | | |
|---|---|---|
| CN | 1109245 | 9/1995 |
| CN | 1256049 | 6/2000 |

(Continued)

OTHER PUBLICATIONS

Lee, J-B and Kalva, H., "Intra Prediction," in the VC-1 and H.264 Video Compression Standards for Broadband Video Services (NY: Springer Science+Business Media), pp. 247-277 (2010).
Weigand, T., et al., Overview of the H.264/AVC Video Coding Standard, IEEE Transactions on Circuits and Systems for Video Technology, 13(7): 560-576 (Jul. 2003).
International Search Report and Written Opinion, PCT/EP2011/052462, dated May 24, 2011.

(Continued)

*Primary Examiner* — William C Vaughn, Jr.
*Assistant Examiner* — Michael J Hess (57) ABSTRACT

An encoder stage, and corresponding encoded bitstream and decoder. The encoder stage comprises: a variable length encoder for encoding an input signal; and a counter configured to dynamically detect an observed frequency at which different symbols are found to occur within each of a plurality of predetermined portions of the input signal, prior to the symbols of each respective portion being encoded by the variable length encoder. The variable length encoder is configured to encode the symbols of each portion using variable length coding performed in dependence on the observed frequencies detected within the respective portion of the input signal, to generate an encoded bitstream comprising the encoded symbols along with an additional element indicating information regarding the observed frequencies detected for each portion, and to output the encoded bitstream to at least one of a storage medium and a transmission medium for supply to a decoder.

20 Claims, 3 Drawing Sheets

(56) References Cited

U.S. PATENT DOCUMENTS

| | | |
|---|---|---|
| 5,790,206 A | 8/1998 | Ju |
| 6,091,767 A | 7/2000 | Westerman |
| 6,091,777 A | 7/2000 | Guetz et al. |
| 6,148,109 A | 11/2000 | Boon et al. |
| 6,201,834 B1 | 3/2001 | Zhu |
| 6,408,026 B1 | 6/2002 | Tao |
| 6,445,810 B2 | 9/2002 | Darrell et al. |
| 6,650,782 B1 | 11/2003 | Joshi et al. |
| 6,668,020 B2 | 12/2003 | Ma et al. |
| 6,697,427 B1 | 2/2004 | Kurak, Jr. et al. |
| 6,856,651 B2 | 2/2005 | Singh |
| 7,430,329 B1 | 9/2008 | Sarna |
| 8,681,873 B2 | 3/2014 | Bivolarsky et al. |
| 8,913,661 B2 | 12/2014 | Bivolarsky et al. |
| 9,078,009 B2 | 7/2015 | Bivolarsky et al. |
| 9,313,526 B2 | 4/2016 | Bivolarsky et al. |
| 9,609,342 B2 | 3/2017 | Bivolarsky et al. |
| 2001/0002205 A1 | 5/2001 | Beattie |
| 2001/0014124 A1 | 8/2001 | Nishikawa |
| 2002/0012396 A1 | 1/2002 | Pau et al. |
| 2003/0001757 A1 | 1/2003 | Kondo et al. |
| 2003/0016751 A1 | 1/2003 | Vetro et al. |
| 2003/0026340 A1 | 2/2003 | Divakaran et al. |
| 2003/0067981 A1 | 4/2003 | Zhao et al. |
| 2003/0081678 A1 | 5/2003 | Fukuda |
| 2003/0179825 A1 | 9/2003 | Sekiguchi et al. |
| 2003/0206588 A1 | 11/2003 | Etoh et al. |
| 2004/0021592 A1* | 2/2004 | Karczewicz .................. 341/67 |
| 2004/0057516 A1 | 3/2004 | Kim et al. |
| 2004/0170395 A1 | 9/2004 | Filippini et al. |
| 2004/0213348 A1 | 10/2004 | Kim et al. |
| 2004/0228540 A1 | 11/2004 | Chen et al. |
| 2005/0041740 A1 | 2/2005 | Sekiguchi et al. |
| 2005/0094727 A1 | 5/2005 | Ha et al. |
| 2005/0229200 A1 | 10/2005 | Kirkland et al. |
| 2006/0013303 A1 | 1/2006 | Nguyen et al. |
| 2006/0104352 A1 | 5/2006 | Chen et al. |
| 2006/0120452 A1 | 6/2006 | Li |
| 2006/0152597 A1 | 7/2006 | Shimizu |
| 2006/0153295 A1 | 7/2006 | Wang et al. |
| 2006/0239354 A1 | 10/2006 | Amano et al. |
| 2007/0104381 A1 | 5/2007 | Chen et al. |
| 2007/0116370 A1* | 5/2007 | Smirnov .................. 382/245 |
| 2007/0120967 A1 | 5/2007 | Eshkoli et al. |
| 2007/0172135 A1 | 7/2007 | Song |
| 2007/0177671 A1 | 8/2007 | Yang |
| 2007/0217511 A1 | 9/2007 | Li et al. |
| 2007/0253480 A1 | 11/2007 | Tsujii et al. |
| 2008/0037642 A1 | 2/2008 | Tsuchiya |
| 2008/0075171 A1 | 3/2008 | Suzuki |
| 2008/0095230 A1 | 4/2008 | Hannuksela et al. |
| 2008/0123750 A1 | 5/2008 | Bronstein et al. |
| 2008/0192838 A1 | 8/2008 | Chen et al. |
| 2008/0240247 A1 | 10/2008 | Lee et al. |
| 2008/0273516 A1 | 11/2008 | Subramania et al. |
| 2009/0003437 A1 | 1/2009 | Cho et al. |
| 2009/0060362 A1 | 3/2009 | Harmanci et al. |
| 2009/0067503 A1 | 3/2009 | Jeong et al. |
| 2009/0080788 A1 | 3/2009 | Lynch et al. |
| 2009/0080804 A1 | 3/2009 | Hamada et al. |
| 2009/0097548 A1 | 4/2009 | Karczewicz et al. |
| 2009/0110054 A1 | 4/2009 | Kim et al. |
| 2009/0180538 A1 | 7/2009 | Visharam et al. |
| 2009/0225830 A1 | 9/2009 | He et al. |
| 2009/0257669 A1 | 10/2009 | Kim et al. |
| 2010/0080297 A1 | 4/2010 | Wang et al. |
| 2010/0166073 A1 | 7/2010 | Schmit et al. |
| 2010/0310065 A1 | 12/2010 | Chang et al. |
| 2011/0050934 A1 | 3/2011 | Mitsunaga |
| 2011/0206110 A1 | 8/2011 | Bivolarsky et al. |
| 2011/0206113 A1 | 8/2011 | Bivolarsky et al. |
| 2011/0206117 A1 | 8/2011 | Bivolarsky et al. |
| 2011/0206118 A1 | 8/2011 | Bivolarsky et al. |
| 2011/0206119 A1 | 8/2011 | Bivolarsky et al. |
| 2011/0206131 A1 | 8/2011 | Vafin et al. |
| 2011/0206132 A1 | 8/2011 | Bivolarsky et al. |
| 2012/0044990 A1 | 2/2012 | Bivolarsky et al. |

FOREIGN PATENT DOCUMENTS

| | | |
|---|---|---|
| CN | 1262496 | 8/2000 |
| CN | 1266589 | 9/2000 |
| CN | 1805544 | 7/2006 |
| CN | 101061722 | 10/2007 |
| CN | 101133650 | 2/2008 |
| CN | 101511014 | 8/2009 |
| CN | 101578769 | 11/2009 |
| CN | 101584120 | 11/2009 |
| EP | 0 639 925 A2 | 2/1995 |
| EP | 0639925 | 2/1995 |
| EP | 0 679 033 A2 | 10/1995 |
| EP | 0679033 | 10/1995 |
| EP | 1024456 | 8/2000 |
| EP | 1024456 A2 | 8/2000 |
| JP | 2007-60437 A | 3/2007 |
| JP | 200760437 | 3/2007 |
| JP | 2007060437 | 3/2007 |
| JP | 2009509408 | 3/2009 |
| WO | WO 00/27128 | 5/2000 |
| WO | WO-0027128 | 5/2000 |
| WO | WO 2007/011851 A2 | 1/2007 |
| WO | WO-2007011851 | 1/2007 |

OTHER PUBLICATIONS

Richardson, I.E., "H.264 and MPEG-4," H.264 and MPEG-4 Video Compression: Video Coding for Next-generation Multimedia, Chapter 6, Part 10, XP030001626, ISBN: 0-470-84837-5 (Oct. 17, 2003).

Richardson, I.E., "Design and Performance," H.264 and MPEG-4 Video Compression: Coding for Next-generation Multimedia, Chapter 7, pp. 225-234, XP030001627, ISBN: 0-470-84837-5 (Oct. 17, 2003).

Song, M., et al., "Motion Estimation in DCT Domain," 1996 International Conference on Beijing Communication Technology Proceedings, 2: 670-674 (May 5, 1996).

Freina, T., et al., "Predictive Fractal Image Coding: Hybrid Algorithms and Compression of Residuals," 1998 Data Compression Conference, p. 549 (Mar. 30, 1998).

Vasconcelos, N., et al., "Library-based image coding," Proceedings of the International Conference on Acoustics, Speech and Signal Processing, 19: 489-492 (Apr. 19, 1994).

Vasconcelos, N., et al., "Library-based coding: a representation for efficient video compression and retrieval," Data Compression Conference, pp. 121-130 (Mar. 25, 1997).

Invitation to Pay Additional Fees and Partial International Search Report, PCT/EP2011/052464, dated Jun. 29, 2011.

Schultz, R., et al., "Subpixel Motion Estimation for Super-Resolution Image Sequence Enhancement," Journal of Visual Communication and Image Representation, vol. 9(1), pp. 38-50 (1998).

Ben-Ezra, M., et al., "Video Super-Resolution Using Controlled Subpixel Detector Shifts," IEEE Transactions on Pattern Analysis and Machine Intelligence, vol. 27(6), pp. 977-987 (2005).

Segall, A., et al., "Improved High-Definition Video by Encoding at an Intermediate Resolution," Visual Communications and Image Processing, SPIE vol. 5308, pp. 1007-1018 (2004).

Barreto, D., et al., "Region-based Super-Resolution for Compression," Multidim Syst Sign Process, vol. 18, pp. 59-81 (2007).

Molina, R., et al., "Toward a New Video Compression Scheme Using Super-Resolution," Visual Communications and Image Processing, SPIE vol. 6077 (2006).

Invitation to Pay Additional Fees and, Where Applicable, Protest Fee, dated Jul. 5, 2011, for Application No. PCT/EP2011/052465, consisting of 11 pages.

International Search Report and Written Opinion, PCT/EP2011/052464, dated Sep. 1, 2011.

(56) References Cited

OTHER PUBLICATIONS

Hoang, D.T., et al., "Efficient cost measures for motion compensation at low bit rates," Data Compression Conference, pp. 102-111 (Mar. 31, 1996).
Sullivan, G.J., et al., "Rate-Distortion Optimization for Video Compression," IEEE Signal Processing Magazine, 15(6): 74-90 (Nov. 1, 1998).
Hayes, M.H., "Iterated Function Systems for Image and Video Coding," Journal on Communications, 45: 11-19 (May 1, 1994).
Rodrigues, N.M.M., et al., "Improving multiscale recurrent pattern image coding with enhanced dictionary updating strategies," Telecommunications Symposium, pp. 257-262 (Sep. 1, 2006).
Chang, S., et al., "Manipulation and compositing of MC-DCT compressed video," Journal on Selected Areas in Communications, 13(1): 1-11 (Jan. 1, 1995).
Notification of Transmittal of the International Search Report and the Written Opinion of the International Searching Authority for Int'l Application No. PCT/EP2011/052465; dated Sep. 26, 2011.
Mingzhou, S., et al., "Motion Estimation in DCT Domain," IEEE, vol. 5, pp. 670-674 (1996).
Richardson, I. E., "H.264 and MPEG-4 Video Compression. Chapter 7: Design and Performance," pp. 225-267 (2003).
Notification of Transmittal of the International Search Report and the Written Opinion of the International Searching Authority, or the Declaration, for Application No. PCT/EP2011/052460, dated May 24, 2011, consisting of 19 pages.
Notification of Transmittal of the International Search Report and the Written Opinion of the International Searching Authority, or the Declaration, International Application: PCT/EP2011/052446, dated Dec. 29, 2011, 13 pp.
Ginzburg, A., et al., "DCT-Domain Coder for Digital Video Applications", 2006 International Conference on Information Technology: Research and Education, pp. 110-114 (Oct. 1, 2006).
Notification of Transmittal of the International Search Report and the Written Opinion of the International Searching Authority, or the Declaration, PCT/EP2011/052458, dated Oct. 14, 2011, 32 pp.
Cavallaro, A. et al., "Perceptual prefiltering for video coding," Intelligent Multimedia, Video and Speech Processing, 2004. Proceedings of 2004 International Symposium on Hong Kong, China, Oct. 20-22, 2004. Piscataway, NJ, USA IEEE, pp. 510-513, XP010801531, Oct. 20, 2004.
Lin, Y.C. et al., "Fast Full-Search Block-Matching Algorithm for Motion-Compensated Video Compression", IEEE Transactions on Communications, IEEE Service Center, Piscataway, NJ, USA, vol. 45, No. 5, XP011008939, May 1, 1997.
Invitation to Pay Additional Fees and, Where Applicable, Protest Fee and Partial International Search for Int'l Application No. PCT/EP2011/052458; dated May 31, 2011, 9 pp.
Hong, G. et al., "SenseCoding: Accelerometer-Assisted Motion Estimation for Efficient Video Encoding," Proceedings of the 2008 ACM International Conference on Multimedia with Co-Located Symposium & Workshops: Area'08, Communicabilityms'08, HCC'08, MIR'08, MS'08, SAME'08, SRMC'08, TVS'08, VNBA'08: Vancouver, BC, Canada, Oct. 27-31, 2008, ACM Pres, Oct. 26, 2008, pp. 749-752, XP007918610.
Lee, S.-W. et al., "Video Rate Control Using an Adaptive Quantization Based on a Combined Activity Measure," Aug. 17, 2005, Knowledge-Based Intelligent Information and Engineering Systems; [Lecture Notes in Computer Science; Lecture Notes in Artificial Intelligence; LNCS], Springer-Verlag, Berlin/Heidelberg, pp. 1297-1302, XP019015301.
Rosenholtz, R. et al., "Perceptual adaptive JPEG coding," Proceedings of the International Conference on Image Processing (ICIP) Lausanne, Sep. 16-19, 1996, New York, IEEE, US, vol. 1, Sep. 16, 1996, pp. 901-904, XP010202284.
Tang, C.-W. et al., "Spatiotemporal Visual Considerations for Video Coding," IEEE Transactions on Multimedia, IEEE Service Center, Piscataway, NJ, US, vol. 9, No. 2, Feb. 1, 2007, pp. 231-238, XP011157485.

Wallace, G.K., "Overview of the JPEG (ISO/CCITT) Still Image Compression Standard," Joint Photographic Expert Group Conference, Crowborough: JPEG Forum Ltd., GB, Nov. 1, 1989, XP017203197.
Bivolarski, L.M., et al., "Design Considerations for Computationally Constrained Two-Way Real-Time Video Communication," Applications of Digital Image Processing XXXII, A.G. Tescher, cd., in Proc. of SPIE, 7443: 74430I-1-74430II-17 (2009).
Xiao, Feng, "DCT-based Video Quality Evaluation," Final Project for EE392J, Winter 2000.
"International Search Report and Written Opinion", International Application No. PCT/EP2011/052449, (dated Apr. 20, 2011), 9 pages.
"International Search Report and Written Opinion", International Application No. PCT/EP2011/052460, (dated May 24, 2011), 19 pages.
"International Search Report and Written Opinion", International Application No. PCT/EP2011/052446, (dated Dec. 29, 2011), 13 pages.
"International Search Report and Written Opinion", International Application No. PCT/EP2011/052458, (dated Oct. 14, 2011), 32 pages.
"International Search Report and Written Opinion", International Application No. PCT/EP2011/052464, (dated Sep. 1, 2011), 25 pages.
"International Search Report and Written Opinion", International Application No. PCT/EP2011/052465, (dated Sep. 26, 2011), 21 pages.
"International Search Report and Written Opinion", International Application No. PCT/EP2011/052462, (dated May 24, 2011), 14 pages.
"Invitation to Pay Additional Fees and, Where Applicable, Protest Fee and Partial International Search", International Application No. PCT/EP2011/052458, (dated May 31, 2011), 9 pages.
"Invitation to Pay Additional Fees and, Where Applicable, Protest Fee and Partial International Search", International Application No. PCT/EP2011/052464, (dated Jun. 29, 2011), 11 pages.
"Invitation to Pay Additional Fees and, Where Applicable, Protest Fee and Partial International Search", International Application No. PCT/EP2011/052465, (dated Jul. 5, 2011), 10 pages.
"Non-Final Office Action", U.S. Appl. No. 12/838,159, (dated Apr. 13, 2012), 11 pages.
"PCT Search Report and Written Opinion", Application No. PCT/EP2011/052463, (dated Mar. 16, 2012), 13 pages.
Barreto, et al., "Region-Based Super-Resolution for Compression", *Multidim Syst Sign Process*, vol. 18, (2007), pp. 59-81.
Ben-Ezra, Moshe et al., "Video Super-Resolution Using Controlled Subpixel Detector Shifts", *IEEE Transactions on Pattern Analysis and Machine Intelligence*, vol. 27(6), (2005), pp. 977-987.
Bivolarski, Lazar M., et al., "Design Considerations for Computationally Constrained Two-Way Real-Time Video Communication", *Applications of Digital Image Processing XXXII, A.G. Tescher, ed., in Proceedings of SPIE*, 7443:7440I-1-74430II-17, (2009), 17 pages.
Cavallaro, Andrea et al., "Perceptual Prefiltering for Video Coding", *Intelligent Multimedia, Video and Speech Processing, 2004. Proceedings of 2004 International Symposium on* Hong Kong, China, Oct. 20-22, 2004. Piscataway, NJ, IEEE, XP010801531, (Oct. 20, 2004), pp. 510-513.
Chang, Shih-Fu et al., "Manipulation and Compositing of MC-DCT Compressed Video", *Journal on Selected Areas in Communications*, 13(1), (Jan. 1, 1995), pp. 1-11.
Freina, Thomas et al., "Predictive Fractal Image Coding: Hybrid Algorithms and Compression of Residuals", *1998 Data Compression Conference*, (Mar. 30, 1998), p. 549.
Ginzburg, Alex et al., "DCT-Domain Coder for Digital Video Applications", *International Conference on Information Technology: Research and Education*, (Oct. 1, 2006), pp. 110-114.
Hayes, "Iterated Function Systems for Image and Video Coding", *Journal on Communications*, 45, (May 1, 1994), pp. 11-19.
Hoang, Dzung T., et al., "Efficient Cost Measures for Motion Compensation at Low Bit Rates", *Data Compression Conference*, (Mar. 31, 1996), 10 pages.

(56) References Cited

OTHER PUBLICATIONS

Hong, Guangming et al., "SenseCoding: Accelerometer-Assisted Motion Estimation for Efficient Video Encoding", *Proceedings of the 2008 ACM International Conference on Multimedia with Co-Located Symposium & Workshops: Area '08, Communicabilityms '08, HCC '08, MIR '08, MS'08, SAME '08, SRMC '08, TVS '08, VNBA '08*: Vancouver, BC, Canada, Oct. 27-31, 2008, XP0079186, (Oct. 26, 2008), pp. 749-752.
Lee, Jae-Beom et al., "Intra Prediction", *The VC-1 and H.264 Video Compression Standards for Broadband Video Services*, NY: Springer Science+Business Media, LLC, (2010), pp. 247-277.
Lee, Si-Woong et al., "Video Rate Control Using an Adaptive Quantization Based on a Combined Activity Measure", *Knowledge-Based Intelligent Information and Engineering Systems; [Lecture Notes in Computer Science; Lecture Notes in Artificial Intelligence; LNCS]*, Springer-Verlag, Berlin/Heidelberg, XP019015301, (Aug. 17, 2005), pp. 1297-1302.
Lin, Yih-Chuan et al., "Fast Full-Search Block-Matching Algorithm for Motion-Compensated Video Compression", *IEEE Transactions on Communications, IEEE Service Center*, Piscataway, NJ, vol. 45, No. 5, XP011008939, (May 1, 1997), pp. 527-531.
Molina, et al., "Towards a New Video Compression Scheme Using Super-Resolution", *Visual Communications and Image Processing, SPIE* vol. 6077, (2006), 11 pages.
Nuno, "Improving Multiscale Recurrent Pattern Image Coding with Enhanced Dictionary Updating Strategies", *Telecommunications Symposium*, (Sep. 1, 2006), pp. 257-262.
Richardson, Iain E., "H.264 and MPEG-4 Video Compression. Chapter 7: Design and Performance", *John Wiley & Sons, Ltd*. ISBN: 0-470-84837-5, (2003), pp. 225-234.
Richardson, Iain E., "H.264/MPEG4 Part 10", *H.264 and MPEG-4 Video Compression: Video Coding for Next-Generation Multimedia*, John Wiley & Sons, Ltd., ISBN: 0-470-84837-5, (Oct. 17, 2003), 12 pages.
Rosenholtz, Ruth et al., "Perceptual Adaptive JPEG Coding", *Proceedings of the International Conference on Image Processing (ICIP)*, Lausanne, Sep. 16-19, 1996, New York, IEEE, US, vol. 1, XP010202284, (Sep. 16, 1996), pp. 901-904.
Schultz, Richard R., et al., "Subpixel Motion Estimation for Super-Resolution Image Sequence Enhancement", *Journal of Visual Communication and Image Representation*, vol. 9(1), (1998), pp. 38-50.
Segall, Andrew et al., "Improved High-Definition Video by Encoding at an Intermediate Resolution", *Visual Communications and Image Processing, SPIE* vol. 5308 (2004), pp. 1007-1018.
Song, Mingzhou et al., "Motion Estimation in DCT Domain", In Proceedings of ICCT 1996,(May 1996), pp. 670-674.
Sullivan, Gary J., et al., "Rate-Distortion Optimization for Video Compression", *IEEE Signal Processing Magazine*, 15(6), (Nov. 1, 1998), pp. 74-90.
Tang, Chih-Wei "Spatiotemporal Visual Considerations for Video Calling", *IEEE Transactions on Multimedia, IEEE Service Center*, Piscataway, NJ, US, vol. 9, No. 2, XP011157485, (Feb. 1, 2007), pp. 231-238.
Vasconcelos, Nuno et al., "Library-Based Coding: A Representation for Efficient Video Compression and Retrieval", *Data Compression Conference*, (Mar. 25, 1997), 10 pages.
Vasconcelos, Nuno et al., "Library-Based Image Coding", *Proceedings of the International Conference on Acoustics, Speech and Signal Processing*, 19, (Apr. 19, 1994), pp. 489-492.
Vitter, Jeffrey S., "Design and Analysis of Dynamic Huffman Codes", *Journal of the Association for Computing Machinery*, vol. 34, No. 4, (1987), pp. 825-845.
Wallace, Gregory K., "Overview of the JPEG (ISO/CCITT) Still Image Compression Standard", *Joint Photographic Expert Group Conference, Crowborough: JPEG Forum Ltd.*, GB, XP017203197, (Nov. 1, 1989), pp. 1-14.
Wiegand, Thomas et al., "Overview of the H.264/AVC Video Coding Standard", *IEEE Transactions on Circuits and Systems for Video Technology*, 13(7), (Jul. 2003), pp. 560-576.

Xiao, Feng "DCT-Based Video Quality Evaluation", *Final Project for EE392J, Winter 2000*, (2000), 10 pages.
Vitter, J. S., "Design and Analysis of Dynamic Huffan Codes," *Journal of the Association for Computing Machinery*, vol. 34, No. 4, pp. 825-845 (1987).
Notification of Transmittal of the International Search Report and the Written Opinion of the International Searching Authority, dated Apr. 20, 2011, for Application No. PCT/EP2011/052449, consisting of 9 pages.
"Final Office Action", U.S. Appl. No. 12/838,159, (dated Jul. 24, 2012), 15 pages.
"Non-Final Office Action", U.S. Appl. No. 12/838,124, (dated Sep. 6, 2012), 18 pages.
"Non-Final Office Action", U.S. Appl. No. 12/838,131, (dated Aug. 30, 2012), 13 pages.
"Non-Final Office Action", U.S. Appl. No. 12/838,139, (dated Dec. 7, 2012), 13 pages.
"Non-Final Office Action", U.S. Appl. No. 12/838,168, (dated Aug. 31, 2012), 16 pages.
"Non-Final Office Action", U.S. Appl. No. 12/838,197, (dated Dec. 7, 2012), 14 pages.
"Restriction Requirement", U.S. Appl. No. 12/838,139, (dated Oct. 1, 2012), 6 pages.
"Restriction Requirement", U.S. Appl. No. 12/838,197, (dated Oct. 16, 2012), 6 pages.
"Notice of Allowance", U.S. Appl. No. 12/838,159, dated Nov. 13, 2013, 12 pages.
"Final Office Action", U.S. Appl. No. 12/838,131, dated Nov. 26, 2013, 13 pages.
"Final Office Action", U.S. Appl. No. 13/029,710, dated Jan. 29, 2014, 20 pages.
Bennett, "Spectra of Quantized Signals", Bell System Technical Journal, vol. 27, Jul. 1948, pp. 446-472.
Brokish, et al., "A-Law and mu-Law Companding Implementations Using the TMS320C54x", Texas Instruments, Application Note: SPRA163A, Dec. 1997, 37 pages.
"A Unified Formulation of Segment Companding Laws and Synthesis of Codecs and Digital Compandors", Bell System Technical Journal, vol. 49, Sep. 1970, pp. 1555-1588.
Smith "Instantaneous Companding of Quantized Signals", Bell System Technical Journal, vol. 36, May 1957, pp. 653-709.
"Final Office Action", U.S. Appl. No. 12/838,139, dated Mar. 27, 2013, 12 pages.
"Final Office Action", U.S. Appl. No. 12/838,197, dated May 9, 2013, 12 pages.
"Final Office Action", U.S. Appl. No. 12/838,131, dated Jan. 30, 2013, 15 pages.
"Final Office Action", U.S. Appl. No. 12/838,124, dated Feb. 15, 2013, 19 pages.
"Final Office Action", U.S. Appl. No. 12/838,168, dated Apr. 12, 2013, 19 pages.
"Information Technology—JPEG 2000 image coding system: Core coding system", ISO 15444 ITU-T Recommendation T.800, Aug. 2002, 212 pages.
"Notice of Allowance", U.S. Appl. No. 12/838,159, dated Mar. 29, 2013, 11 pages.
"Preliminary Examination Report", Application No. PCT/EP2011/052465, Jun. 5, 2012, 10 pages.
"Restriction Requirement", U.S. Appl. No. 13/029,710, dated Jun. 10, 2013, 6 pages.
"Non-Final Office Action", U.S. Appl. No. 12/838,131, (dated Aug. 1, 2013),15 pages.
"Non-Final Office Action", U.S. Appl. No. 13/029,710, (dated Aug. 23, 2013),15 pages.
Sullivan, et al., "Video Compression—From Concepts to the H.264/AVC Standard", *Proceedings of the IEEE* vol. 93, No. 1, (Jan. 2005), pp. 18-31.
"Non-Final Office Action", U.S. Appl. No. 12/838,131, dated Feb. 27, 2014, 18 pages.
"Extended European Search Report", EP Application No. 13166503.6, dated Nov. 27, 2013, 7 pages.
"Final Office Action", U.S. Appl. No. 12/838,124, dated Jun. 5, 2014, 19 pages.

(56) References Cited

OTHER PUBLICATIONS

"Final Office Action", U.S. Appl. No. 12/838,131, dated Jun. 6, 2014, 9 pages.
"Final Office Action", U.S. Appl. No. 13/029,710, dated Nov. 17, 2014, 21 pages.
"Foreign Office Action", CN Application No. 201180010061.0, dated Aug. 11, 2014, 17 pages.
"Non-Final Office Action", U.S. Appl. No. 12/838,139, dated Jul. 31, 2014, 16 pages.
"Non-Final Office Action", U.S. Appl. No. 12/838,168, dated Aug. 1, 2014, 16 pages.
"Non-Final Office Action", U.S. Appl. No. 12/838,197, dated Aug. 14, 2014, 14 pages.
"Non-Final Office Action", U.S. Appl. No. 13/029,710, dated Jul. 14, 2014, 17 pages.
"Notice of Allowance", U.S. Appl. No. 12/838,131, dated Aug. 11, 2014, 7 pages.
"Foreign Office Action", CN Application No. 201180010048.5, dated May 15, 2015, 10 pages.
"Foreign Office Action", CN Application No. 201180010045.1, dated Apr. 30, 2015, 12 pages.
"Final Office Action", U.S. Appl. No. 12/838,139, dated May 20, 2015, 17 pages.
"Notice of Allowance", U.S. Appl. No. 12/838,197, dated Mar. 2, 2015, 8 pages.
"Final Office Action", U.S. Appl. No. 12/838,124, dated Jun. 2, 2015, 23 pages.
"Foreign Office Action", CN Application No. 201180010061.0, dated Jun. 12, 2015, 10 pages.
"Non-Final Office Action", U.S. Appl. No. 13/029,710, dated Jul. 8, 2015, 22 pages.
"Supplemental Notice of Allowance", U.S. Appl. No. 12/838,197, dated Jun. 5, 2015, 2 pages.
"Foreign Office Action", CN Application No. 201180010045.1, dated Nov. 2, 2015, 7 pages.
"Foreign Office Action", CN Application No. 201180010082.2, dated Sep. 2, 2015, 8 pages.
"Foreign Office Action", CN Application No. 201180010090.7, dated Sep. 9, 2015, 8 pages.
"Foreign Office Action", CN Application No. 201180010098.3, dated Oct. 21, 2015, 7 pages.
"Foreign Office Action", CN Application No. 201180010289.X, dated Nov. 2, 2015, 11 pages.
"Foreign Office Action", EP Application No. 11705195.3, dated Sep. 15, 2015, 4 pages.
"Final Office Action", U.S. Appl. No. 12/838,168, dated Jan. 2, 2015, 18 pages.
"Foreign Office Action", CN Application No. 201180010045.1, dated Oct. 8, 2014, 22 pages.
"Foreign Office Action", CN Application No. 201180010082.2, dated Nov. 25, 2014, 17 pages.
"Foreign Office Action", CN Application No. 201180010090.7, dated Nov. 3, 2014, 16 pages.
"Foreign Office Action", CN Application No. 201180010098.3, dated Dec. 2, 2014, 12 pages.
"Foreign Office Action", CN Application No. 201180010214.1, dated Nov. 25, 2014, 16 pages.
"Foreign Office Action", CN Application No. 201180010289.X, dated Dec. 16, 2014, 14 pages.
"Foreign Office Action", EP Application No. 11705195.3, dated Oct. 21, 2014, 5 pages.
"Foreign Office Action", EP Application No. 11705195.3, dated Dec. 3, 2013, 5 pages.
"Non-Final Office Action", U.S. Appl. No. 12/838,124, dated Jan. 12, 2015, 20 pages.
Hoang, et al., "Efficient Cost Measures for Motion Estimation at Low Bit Rates", IEEE Transactions on Circuits and Systems for Video Technology vol. 8 No. 4, Aug. 31, 1998, 13 pages.
Netravali, et al., "Digital Pictures", 2nd Edition, Plenum Press, Ch. 1, pp. 38-39; Ch. 5 pp. 366-367 & pp. 406-409; Ch. 6 pp. 540-543., Jan. 31, 1995, 6 pages.
Song, "Research on Super Resolution Reconstruction of Video and Image Sequences", China Doctor Dissertation, Full-text Database, Collection of Information, Science and Technology—English Abstract pp. 8-9, Jan. 15, 2014, 44 pages.
Zhu, et al., "Transform-Exempted Calculation of Sum of Absolute Hadamard Transformed Differences", IEEE Transactions on Circuits and Systems for Video Technology archive vol. 19 Issue 8, Aug. 2009, 6 pages.
"Corrected Notice of Allowance", U.S. Appl. No. 13/029,710, dated Dec. 9, 2015, 2 pages.
"Foreign Office Action", CN Application No. 201180010061.0, dated Nov. 11, 2015, 11 pages.
"Foreign Office Action", CN Application No. 201180010082.2, dated Dec. 9, 2015, 8 pages.
"Notice of Allowance", U.S. Appl. No. 13/029,710, dated Nov. 25, 2015, 7 pages.
"Foreign Notice of Allowance", CN Application No. 201180010082.2, dated Apr. 21, 2016, 4 pages.
"Foreign Notice of Allowance", CN Application No. 201180010098.3, dated Apr. 21, 2016, 4 pages.
"Foreign Notice of Allowance", CN Application No. 201180010289.X, dated Apr. 7, 2016, 4 pages.
"Foreign Office Action", CN Application No. 201180010048.5, dated Jun. 2, 2016, 9 pages.
"Foreign Office Action", CN Application No. 201180010061.0, dated Apr. 21, 2016, 6 pages.
"Foreign Office Action", CN Application No. 201180010214.1, dated May 10, 2016, 6 pages.
"Foreign Notice of Allowance", CN Application No. 201180010214.1, dated Jan. 10, 2017, 4 pages.
"Non-Final Office Action", U.S. Appl. No. 12/838,139, dated Feb. 21, 2017, 10 pages.
"Notice of Allowance", U.S. Appl. No. 12/838,124, dated Dec. 8, 2016, 5 pages.
"Corrected Notice of Allowance", U.S. Appl. No. 13/029,710, dated Feb. 16, 2016, 2 pages.
"Corrected Notice of Allowance", U.S. Appl. No. 13/029,710, dated Mar. 14, 2016, 2 pages.
"Examiner's Answer to Appeal Brief", U.S. Appl. No. 12/838,168, dated Feb. 12, 2016, 27 pages.
"Foreign Office Action", CN Application No. 201180010045.1, dated Feb. 15, 2016, 7 pages.
"Foreign Office Action", CN Application No. 201180010048.5, dated Feb. 14, 2016, 13 pages.
"Foreign Office Action", CN Application No. 201180010090.7, dated Feb. 22, 2016, 7 pages.
"PTAB Decision", U.S. Appl. No. 12/838,168, dated Apr. 4, 2017, 14 pages.
"Foreign Office Action", EP Application No. 11704978.3, dated Aug. 24, 2017, 6 pages.
"Foreign Office Action", EP Application No. 11704449.5, dated Sep. 21, 2017, 6 pages.
"Foreign Office Action", EP Application No. 11706788.4, dated Jul. 6, 2017, 8 pages.
"Foreign Office Action", EP Application No. 11704450.3, dated Aug. 24, 2017, 8 pages.

\* cited by examiner

ENTROPY ENCODING BASED ON OBSERVED FREQUENCY

RELATED APPLICATION

This application claims the benefit of U.S. Provisional Application No. 61/306,381, filed on Feb. 19, 2010. The entire teachings of the above application(s) are incorporated herein by reference.

TECHNICAL FIELD

The present invention relates to variable length coding (VLC), whereby a bitstream comprising a plurality of symbols is encoded using variable length codes. This is sometimes referred to as entropy encoding, because it allows the average number of bits per symbol to be reduced to closer to the theoretical minimum (the "entropy") for a particular bitstream.

BACKGROUND

A simple coding scheme would encode all symbol values with the same number of bits. The minimum required number of bits per value is $\log_2(n_v)$, where $n_v$ is the number of possible values a symbol can take. The average number of bits over all values is therefore also $\log_2(n_v)$.

A more efficient coding scheme encodes symbol values that are expected to occur more frequently with fewer bits, and symbol values that are expected to occur less frequently with more bits. There are a number of ways to do this, but for illustration one way is to let the number of leading zeros in the encoded symbol indicate the length of the encoded symbol. Different possible symbol values v are then mapped to the different length symbol codes c, e.g.:

| Code number | Symbol code (c) | Maps to symbol value (v) |
|---|---|---|
| 0 | 1 | $v_a$ |
| 1 | 010 | $v_b$ |
| 2 | 011 | $v_c$ |
| 3 | 00100 | $v_d$ |
| 4 | 00101 | $v_e$ |
| 5 | 00110 | $v_f$ |
| 6 | 00111 | $v_g$ |
| 7 | 0001000 | $v_h$ |
| 8 | 0001001 | $v_i$ |
| etc . . . | etc . . . | etc . . . |

The encoder and decoder both have a pre-stored copy of this VLC look-up table. So if the decoder receives a 1 as the first bit of an encoded symbol, it knows this is a one-bit encoded symbol representing code number 0, which maps to symbol value $v_a$. If the decoder receives one leading 0 before receiving the first 1, it knows this is a three-bit encoded symbol representing code number 1 or 2 depending on the third bit, which map to symbol values $v_b$ and $v_c$ respectively. If the decoder receives two leading 0s before receiving the first 1, it knows this is a five-bit encoded symbol representing one of code numbers 3 to 6 depending on the fourth and fifth bits, which map to symbol values $v_d$ to $v_g$ respectively; and so forth.

This is an example of a set of "prefix" codes, whereby no shorter code is equal to the prefix of any longer code. As mentioned however, this is only one example given for illustrative purposes. Other sets of prefix codes are in common use, such as Huffman codes for example. Other types of variable length coding schemes are also possible, such as those not based on this principle of prefixes, or those that are not in themselves uniquely decodable and rely on some additional known constraint on the bitstream in order to decode. Another type of variable length encoding is arithmetic encoding, which does not map each symbol value onto an individual respective code, but instead encodes a group of symbols together with one overall code.

Such variable length schemes result in a lower average number of bits over all values, compared to assigning the same number of bits to all symbol values. The theoretically minimum possible average number of bits is called entropy and is defined as $H=-\Sigma_i(p_i \cdot \log_2(p_i))$, where $p_i$ is the probability of the $i^{th}$ symbol value. Therefore such a coding scheme is sometimes called an entropy coder.

Entropy coding relies on availability of some information regarding the relative probabilities of symbol values. Such information may be referred to as the "probability mass function" (PMF), i.e. in this case the likely frequency at which the different possible symbol values are expected to occur relative to one another within the bitstream. Information about the PMF is required at both the encoder and the decoder side (the latter is needed for correct decoding). For example, this information may take the form of a VLC look-up table pre-stored at the encoder and encoder, mapping of symbol values v to the different codes c.

For efficient entropy coding, the available PMF should represent the expected frequencies as accurately as possible. To achieve this, the PMF is conventionally pre-trained at the design stage by using a large set of data that represent symbols to be encoded. This "globally" trained PMF is then pre-stored at the encoder and the decoder.

To further increase coding efficiency, the pre-stored PMF is often adapted during the coding and decoding process. In this ease, a small number of predetermined alternative PMFs are pre-trained for different scenarios, and each alternative is pre-stored at both the encoder and decoder. The encoder and decoder then select the relevant PMF for encoding and decoding a current symbol by observing the previously-coded symbol values.

Examples of such adaptive entropy coding schemes are context-adaptive variable length coding (CAVLC) and context-adaptive binary arithmetic coding (CABAC) used in MPEG Video coding. These are currently defined in the H.264 standard of the Joint Video Team (JVT) of the International Organization for Standardization (ISO) and International Electrotechnical Commission (IEC), comprising the Moving Picture Experts Group (MPEG) and International Telecommunications Union Video Coding Experts Group (ITU-T VCEG).

Figure 1A:
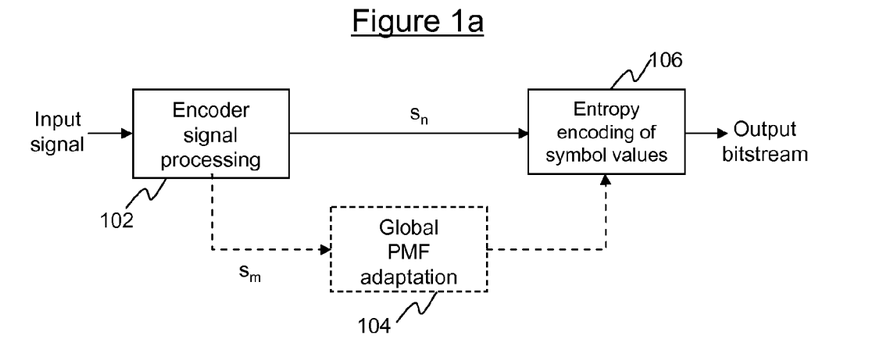
FIG. 1a is a schematic block diagram of an encoder.

FIG. 1a is a schematic block diagram of a conventional CAVLC video encoder. Each video frame (i.e. the image at each moment in time) is sub-divided into a plurality of smaller blocks. The input signal is first passed through earlier signal processing stages 102 which perform encoding such as intraframe prediction encoding and interframe motionprediction, to achieve an initial compression by exploiting properties of the video content such as correlation between nearby blocks and movement of blocks between frames. The input signal is then passed to an entropy encoder 106 for further compression based on variable length coding (VLC). A handful of different pre-trained PMFs are pre-stored at the entropy encoder 106, in the form of a plurality of predetermined VLC look-up tables each being a potential candidate for encoding a current symbol $s_n$.

To achieve adaption, a global PMF adaptation block 104 is arranged to select an appropriate one of the VLC look-up tables for encoding a symbol $s_n$ of the current block. The selection is based on certain previously encoded symbols $s_m$. For example in CAVLC the selection is based on the number of non-zero coefficients in certain previously encoded blocks, and on previously encoded elements in the current block.

Figure 1B:
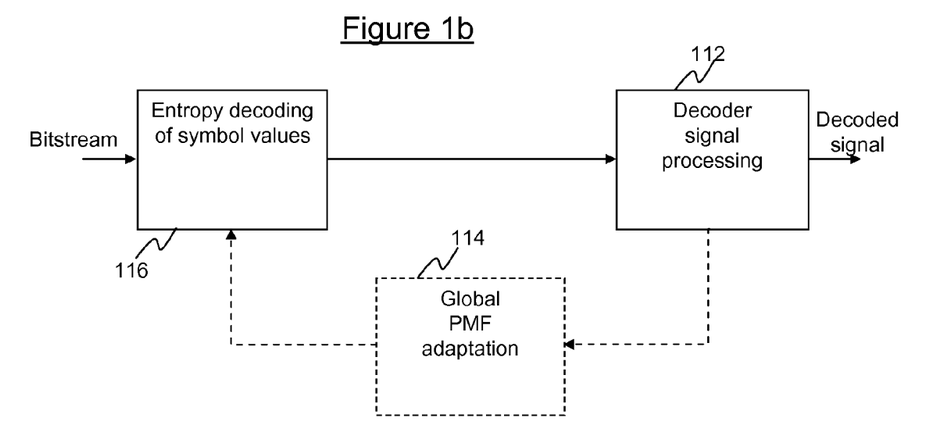
FIG. 1b is a schematic block diagram of a decoder.

A corresponding decoder is illustrated in FIG. 1b. The incoming bit stream is first passed to an entropy decoder 116, then to later stages 112 such as intraframe prediction decoding and interframe motion prediction decoding stages. The same few pre-trained VLC look-up tables as stored at the encoder are also pre-stored at the entropy decoder 116. The decoder also has the same knowledge of the previous symbol values $v[s_m]$ as the encoder (because it has already just decoded those symbols). Given this knowledge of previously decoded symbols $s_m$, a global PMF adaption block 114 in the decoder can therefore deterministically ascertain the VLC look-up table that the encoder must have used to encode a current encoded symbol $c(v[s_n])$, and thus control the entropy decoder 116 to decode the current symbol $s_n$ accordingly.

CABAC works in a similar manner, but can also apply an additional adaptation by updating the global PMF based on a previously encoded block and previously encoded symbols in the current block. That is, CABAC adapts not only by selecting between pre-stored look-up tables, but also by modifying the pre-stored look-up tables based on previously encoded symbol values. The decoder can determine the same modification to apply to the look-up tables as applied by the encoder, because the decoder has already previously decoded the same symbols that were used to determine that modification at the encoder.

SUMMARY

As discussed, in prior systems the VLC look-up tables are pre-stored at the encoder and decoder, and so can only describe how frequently symbol values are expected to occur. That is, the PMF is pre-trained based on a large set of test data at the design stage. Even in the adaptive case, this only involves selecting between a few pre-stored, pre-trained VLC look-up tables based on certain previously encoded symbols, and/or by updating a pre-trained PMF based on previously encoded symbols.

According to one aspect of the present invention on the other hand, there is provided an encoder stage for encoding an input signal comprising a plurality of different symbols, the encoder stage comprising: a variable length encoder for encoding the input signal; and a counter configured to dynamically detect an observed frequency at which the different symbols are found to occur within each of a plurality of predetermined portions of the input signal, prior to the symbols of each respective portion being encoded by the variable length encoder; wherein the variable length encoder is configured to encode the symbols of each portion using variable length coding performed in dependence on the observed frequencies detected within the respective portion of the input signal, to generate an encoded bitstream comprising the encoded symbols along with an additional element indicating information regarding the observed frequencies detected for each portion, and to output the encoded bitstream to at least one of a storage medium and a transmission medium for supply to a decoder.

The present invention thus trains a probability function dynamically, "on the fly", based on actual observed symbol values in the input signal to be encoded. That is, it makes an a posteriori empirical measurement of how frequently symbols actually occur within a given portion of the input signal such as a certain time interval, and uses that information to encode the symbols of that same interval of the input signal. It also outputs information about the observed frequency into the encoded bitstream for supply to the decoder, so that the decoder can determine how the symbols of each interval were encoded and therefore decode them accordingly.

Preferably the input signal comprises at least one of a video signal, a speech signal or another kind of audio signal. In this case the time intervals used in the above approach are preferably video frames (each representing the video image at a different respective moment in time), speech frames (each representing a speech interval such as predetermined number of voice pitch periods), and/or audio frames of an audio standard such as an MPEG audio standard. The invention may thus allow the PMF to be adapted on a per frame basis, with the probability mass function (PMF) estimated on the current audio or video frame being used to facilitate efficient entropy coding of symbol values within the frame. The PMF is transmitted along with entropy-coded symbol values to the decoder as side information.

Referred to in the context of the present invention therefore, the PMF does not describe the likely frequency at which symbol values are expected to occur based on a pre-trained system, but rather the actual frequency at which they did occur within the frame or interval in question. This may be referred to herein as a local PMF.

While a (possibly adaptive) globally pre-trained PMF may typically provide a good representation of occurrence of symbol values on average, the present invention improves on this by providing a high-degree of adaptation to the current symbol values (e.g. within a frame). The result is a lower average number of bits per symbol in the output bit stream.

The present invention does require some extra information about the PMF to be included in the output bitstream. This is unlike the global adaptive PMF techniques such as CAVLC and CABAC, which do not insert information about the PMF into the output bitstream. Instead, because these conventional global techniques adapt the VLC coding based on previously encoded symbols, then the decoder can determine the adaption applied to a current symbol based on the previously decoded symbols using the same criterion as the encoder, without needing explicit information about the PMF to be provided in the bitstream.

However, because a frame or other short interval typically only contains few symbols, the inventors have recognised that the resulting PMF will usually be sparse and therefore can be efficiently encoded with a small number of bits (unlike the global PMF trained on a large set of data which would not be sparse and would not be included in the encoded output bitstream). So although the present invention does require some extra information about the PMF to be included in the output bitstream, the inventors have recognised that this is outweighed by the reduced number of average bits per symbol achieved by the local adaption based on actual observed symbol values. Therefore, the present invention can still result in a lower average number of bits for coding of symbol values compared to the global PMF techniques, with the sparse local PMF itself being efficiently coded with a low number of bits of side information.

If the number of bits required to encode symbol values using the conventional global PMF is R(symbols, global); the number of bits required to encode symbol values using the improved, highly-adaptive local PMF of the present invention is R(symbols, local); and the number of bits required to transmit side information for such local adaption is R(side info); then the present invention will in many cases achieve: R(symbols, local)+R(side info)<R(symbols, global).

In embodiments, the variable length encoder may be arranged to encode more frequent symbols of the input signal with codes having fewer bits, and to encode less frequent symbols of the input signal with codes having more bits; wherein the variable length encoder may be configured to map the different length codes to the symbols based on the observed frequencies detected within said portion of the input signal, and encode the symbols of said portion of the input signal using said mapping.

In further embodiments, the variable length encoder may be configured to switch between (i) a first mode of operation in which the symbols of each portion are encoded in dependence on the observed frequencies detected for the respective portion, and (ii) a second mode of operation in which the variable length encoding is either non-adaptive or adapted based on previously encoded symbols.

The variable length encoder may be configured to determine whether to switch between said modes of operation once per number of said portions, in dependence on a relative efficiency metric of the modes for the respective number of portions.

Said number may be one, such that the variable length encoder may be configured to determine whether to switch between said modes of operation once per portion, in dependence on a relative efficiency metric of the modes for the respective portion.

The variable length encoder may be configured to encode said information on the observed frequencies for inclusion in the output bitstream, based on a known constraint on a total number of occurrences within each portion.

The variable length encoder may be configured to encode said information on the observed frequencies for inclusion in the output bitstream by predicting the occurrences of less frequent symbols based on the occurrences of more frequent symbols.

The variable length encoder may be configured to encode said information on the observed frequencies for inclusion in the output bitstream using run-length coding.

The variable length encoder may be configured to encode said information on the observed frequencies for inclusion in the output bitstream by differentially encoding the information of one portion relative to one of: the information of a preceding portion, and a global PMF.

The variable length encoder may be configured to encode said information on the observed frequencies for inclusion in the output bitstream, using a non-lossless encoding.

The counter may be configured to update the observed frequencies for a portion of the input signal after encoding each of a plurality of successive ones of said symbols within the respective portion; and the variable length encoder may be configured to encode each successive symbol of the respective portion using variable length coding performed in dependence on the updated frequencies.

According to another aspect of the present invention, there is provided a bitstream arranged into a plurality of portions, each comprising: a plurality of different encoded symbols, encoded according to an adaptive variable length coding scheme, and an additional element indicating information regarding an observed frequency at which the different symbols occur within the respective portion; wherein the symbols of each portion are encoded according to a variable length encoding scheme adapted in dependence on the observed frequencies of the different symbols within the respective portion, said information being for use by a decoder in decoding each portion.

In embodiments, the bitstream may be encoded according to any of the above features of the encoder.

According to another aspect of the present invention, there is provided a network equipment comprising a transmission medium conveying the bitstream.

According to another aspect of the present invention, there is provided a decoder stage, comprising: a variable length decoder for decoding a bitstream arranged into a plurality of portions, and each portion comprising a plurality of different encoded symbols and an additional element indicating information regarding an observed frequency at which the different symbols occur within the respective portion, wherein the symbols of each portion are encoded according to a variable length encoding scheme adapted in dependence on the observed frequencies of the different symbols within the respective portion; and wherein the variable length decoder is configured to decode the symbols of each portion in dependence on the received information regarding the observed frequencies, and to thereby generate an output signal for output to a user device.

In embodiments, the variable length decoder may be further configured to decode a bitstream encoded according to the above features of the encoder.

BRIEF DESCRIPTION OF THE DRAWINGS

For a better understanding of the present invention and to show how it may be put into effect, reference is made by way of example to the accompanying drawings in which.

DETAILED DESCRIPTION

As discussed, the present invention provides a high-degree of adaptability of an entropy-coding scheme to the actual frequency of occurrence of symbol values within a short interval (e.g., within one audio or video frame), thereby reducing the average number of bits per symbol required for encoding. In preferred embodiments, the PMF is estimated for each frame based on the symbol values in that same frame. This PMF is used to entropy-code the symbol values within the frame and is transmitted along with the entropy-coded symbol values to the decoder as side information to facilitate decoding.

Figure 2A:
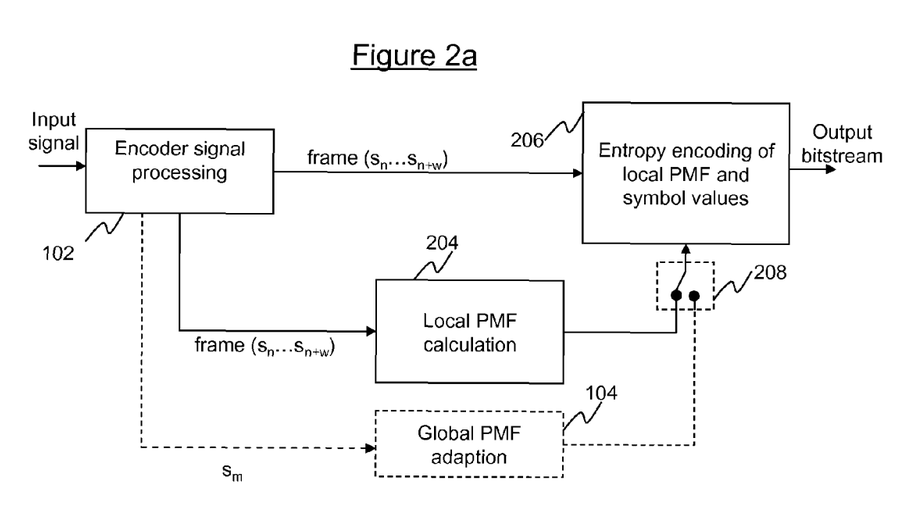
FIG. 2a is a schematic block diagram of an encoder.

FIG. 2a shows an encoder according to an exemplary embodiment of the present invention. The encoder comprises earlier encoder stages 102 arranged to receive an input signal such as a video signal, speech signal or other audio signal. These stages 102 are arranged to perform prediction coding such as intraframe prediction coding and interframe motion prediction in the ease of video coding, or short- and long-term prediction coding in the case of speech encoding, as will be familiar to a person skilled in the art. Following this the encoder comprises an entropy encoder 206 arranged to receive the (now partially processed) input signal after passing through the earlier encoder stages 102. The entropy encoder is arranged to perform variable length entropy encoding on this received input signal, to thereby generate an output bitstream for output to a transmission medium (e.g. for transmission over a network such as the internet) or storage medium (e.g. for storage on a hard drive or flash memory).

The encoder further comprises a local PMF calculation block 204, having an input also arranged to receive the (partially processed) input signal from the earlier stages 102, and having an output arranged to supply control signals to the entropy encoder 206. However, this local PMF calculation block is not like the global PMF adaption block 104 of FIG. 1a, which selects an adaption based on symbols of the input signal that have already been received and encoded by the entropy encoder 106 (e.g. selected based on previous symbols $s_m$ whilst the current block being encoded by the entropy encoder 106 is a subsequent symbol $s_n$). That is, the adaptation by the global PMF block 104 is obtained by observing the previously encoded symbol values. In contrast, the local PMF calculation block 204 of FIG. 2a comprises a counter which counts the actual number of occurrences of the different possible symbol values within each frame (e.g. comprising symbols $s_n \ldots s_{n+w}$ of a current block), in order to determine a PMF for use in adapting the variable length encoding of that same frame (e.g. comprising the same symbols $s_n \ldots s_{n+w}$ of the same current block).

This does not involve reference to previously encoded symbols or blocks as in the conventional CAVLC or CABAC techniques or such like. The local PMF calculation block 204 thus looks ahead to forthcoming symbols yet to be encoded within the current frame or other current time interval (and only within that frame or interval), rather than looking back at previously encoded symbols.

The local PMF calculation block 204 thus empirically observes the actual a posteriori number of occurrences of each symbol within the frame or interval about to be encoded by the entropy encoder 206, as opposed to relying on a pre-trained PMF which only describes how frequently the symbols are expected to occur based on a pre-trained simulation or test. The local PMF calculation block 204 then outputs a control signal to the entropy encoder 206 providing information on the observed PMF, which the entropy encoder 206 then uses to adapt the variable length encoding accordingly.

For example, the local PMF calculation block 204 can dynamically determine an ad-hoc, bespoke VLC look-up table mapping of symbol values v to codes c, populated for the frame based on the frequency at which the different symbol values v are found to actually occur within that same frame.

The PMF itself is also inserted into the output bitstream as side information. The PMF side information can be encoded efficiently using a number of methods. The main preferred principles are explained below, any or all of which can be used to encode the PMF side information.

(i) $\Sigma_i (p_i)$ is known to be 1 (can be a different known value in computer representation). That is, the total number of symbols must add up to a certain number determined by the size of the frame or interval.

(ii) By encoding first the probabilities of the most-probable symbol values, the probabilities of less-probable symbol values become more predictable (often zeros in a sparse PMF).

(iii) The sparse PMF can be coded efficiently using run-length-coding techniques.

(iv) The PMF of the short interval can be coded differentially with respect to the PMF of previous short interval(s) and/or the global PMF (when available).

(v) The PMF of the short interval can be coded with reduced number of bits and reduced precision (i.e. encoding in a manner that loses some information about the local PMF), since it is often anyway more efficient for the interval than the global PMF. This would reduce the bitrate incurred by the side information at a cost of only a small increase of rate for the symbols. It is important to note that then the reduced-precision PMF has to be used to both encode and decode the symbol values.

Figure 2B:
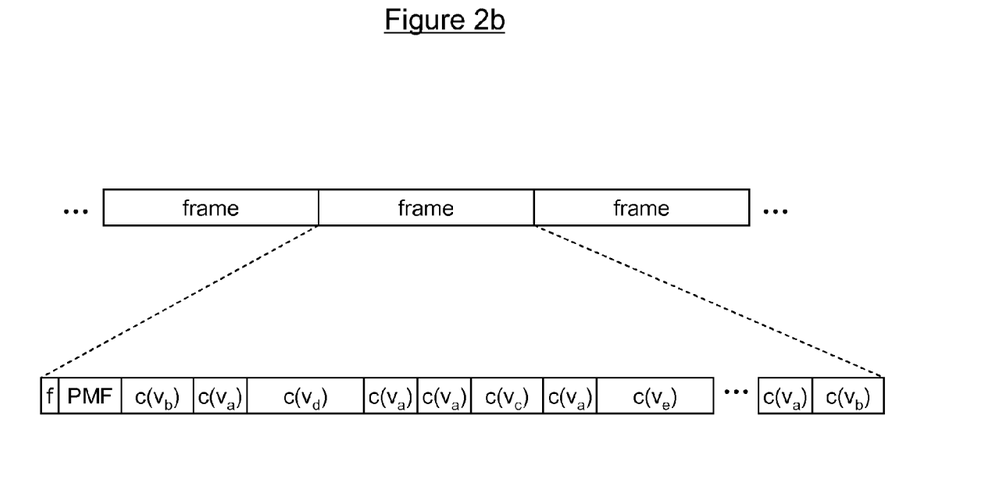
FIG. 2b is a schematic representation of au output bitstream.

FIG. 2b shows an example bitstream as output by the encoder of FIG. 2a. The bitstream comprises a plurality of frames, and each frame comprises a plurality of codes c plus compressed information about the local observed PMF for that same respective frame. The local PMF is transmitted as side information, i.e. it is a part of the bitstream.

As discussed, conventional global adaptive PMF techniques such as CAVLC and CABAC do not transmit the PMF as side information because the decoder determines the VLC adaption based on previously decoded symbols, in the same manner as the encoder. Although the present invention does require information about the PMF to be included in the output bitstream, the reduced average number of bits per symbol achieved by the local a posteriori adaption outweighs the extra bits required to transmit the PMF as side information.

Figure 2C:
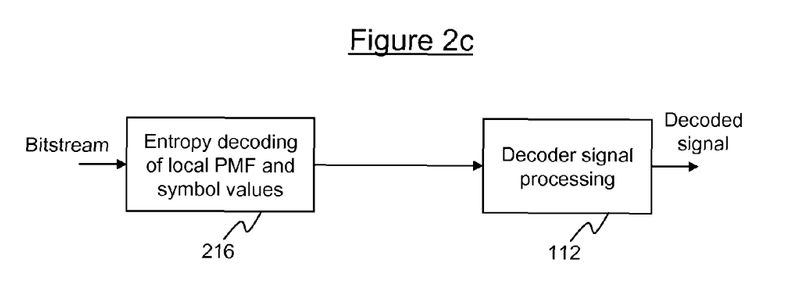
FIG. 2c is a schematic block diagram of a decoder.

FIG. 2c shows an exemplary decoder according to embodiments of the present invention. This comprises an entropy decoder 216 arranged to receive the encoded symbols and the PMF side information of each frame from the encoded bitstream. For each frame, the entropy decoder 216 uses the received local PMF for the respective frame to determine the relative frequency of occurrence of the symbols within that frame, and therefore to derive the adapted manner in which they were encoded by the entropy encoder 206 (e.g. to reconstruct the bespoke VLC look-up table used to encode the symbols). The entropy decoder 216 then decodes the symbols accordingly and outputs the decoded symbol values to the later stages 112 of the decoder to produce an output signal for output to a user. E.g. a video signal for display on a video screen, and/or speech or other audio signal for playing out of a speaker.

As illustrated in FIG. 2a, the described technique may optionally be augmented by comparing the efficiency of the highly-adaptive PMF with that of the global PMF. That is, comparing R(symbols, local)+R(side info) with R(symbols, global) for each frame, and choosing the best option for the frame. To this end, the encoder comprises a switch 208 configured to switch between the local adaption 204 and global adaption 104, making the switching decision once per frame in dependence on the comparison. The choice is indicated by a flag f supplied to the decoder as additional side information in the bitstream for each frame (the additional side information to transmit this flag is negligible). This flag f is shown in FIG. 2b. Alternatively the switching decision could be performed once per number of frames instead of necessarily being decided every frame.

In preferred applications of the present invention, the input signal to the encoder comprises at least one of a video signal (e.g. from a webcam), a speech signal (e.g. from a microphone), or another type of audio signal. In the case of a video signal, each frame represents the video image at a different instant in time. In the case of a speech signal, each frame represents a voice interval such as a predetermined number of pitch periods in the case of vocative sounds (pitch period is a term of art in speech encoding, referring to the period of a quasi-periodic waveform modelling an underlying pitch of the voice box). In the case of another type of audio signal, the frame is a predetermined time interval determined according to some particular standard such as MPEG.

Also in preferred applications, the present invention may be used to encode and decode live voice or video over IP (VoIP) calls conducted over a packet-based network such as the Internet. Furthermore, the call may be established using a peer-to-peer (P2P) topology.

It will be appreciated that the above embodiments have been described only by way of example.

For instance, the principle of entropy encoding can apply to encoding the symbols in any bit stream based on the relative frequency of occurence of those symbols within the bit stream, and the present invention is not limited to video encoding, speech encoding or audio encoding, nor any particular standards for such encoding. Further, the present invention is not limited to VoIP or P2P.

Further, to encode the PMF into the output bitstream, it is not necessarily required to transmit the absolute probabilities of the different symbol values. In another embodiment for example, the encoded PMF may comprise an indication of the relative probabilities within the interval, e.g. the relative order from most to least likely such as an indication that $v_c$ is the most likely, $v_a$ is the next most likely, etc., without actually enumerating the probabilities in the side information. So for example the ordered list could be used by the decoder to reconstruct the appropriate VLC look-up table. The invention is not limited to any particular form of PMF, as long as it provides empirical information about the relative frequencies at which the different symbol values are found to occur within the local time interval in question.

Furthermore, the invention is not limited to adaption performed on the basis of any particular video, audio or speech codec frame. Generally speaking, the PMF can be observed and encoded in relation to a plurality of frames, or indeed any portion of the input signal whether it be a discrete time window or otherwise. For example, to achieve further local adaptation it would be possible to transmit two or more local PMFs per time frame, e.g., one PMF for upper part of a video frame image and one PMF for lower part of the image, or one PMF for odd row of pixels and one PMF for even row of pixels. Transmitting more PMFs increases the rate required for side information, but this may be compensated by lower rate of encoding symbol values.

If the local PMF is transmitted in terms of number of occurrences (counts) of each symbol value, then the local PMF may be transmitted prior to encoding/decoding symbol values. In a further embodiments, after encoding/decoding each symbol value, the local PMF may be further updated at both the encoder and the decoder by subtracting 1 from the count of this encoded/decoded symbol. Thus, the local PDF is made even more adaptive for the next symbols.

The invention can also apply to other types of variable length encoding scheme such as arithmetic encoding that does not use a one-to-one mapping between symbol values v and respective codes c. In this case, the manner of encoding the overall codeword could be adapted based on observed frequencies.

The encoder components 102, 204, 206, 104 and 208; and decoder components 216 and 112 each preferably comprise software modules embodied on a non-transitory computer-readable storage medium such as random access memory, read-only memory, compact disk read-only memory, hard drive or flash memory, arranged for execution on one or more processors. However, in alternative embodiments some of all of these components may be implemented at least partially in dedicated hardwired circuitry. The encoder may comprise an output means such as a network interface arranged to transmit the output bitstream to the decoder over a packet-based network such as the internet. In this case the bitstream in transit is embodied on a transmission medium of the network equipment, e.g. in the packet queue(s) of one or more routers. Alternatively or additionally, the encoder output means may comprise memory access circuitry arranged to store the bitstream on a storage medium such as a hard drive or flash memory. The decoder would comprise a corresponding network interface for receiving the bitstream over the network, and/or memory access circuitry for retrieving the bitstream from the storage medium.

It should be understood that the block and flow diagrams may include more or fewer elements, be arranged differently, or be represented differently. It should be understood that implementation may dictate the block and flow diagrams and the number of block and flow diagrams illustrating the execution of embodiments of the invention.

It should be understood that elements of the block and flow diagrams described above may be implemented in software, hardware, or firmware. In addition, the elements of the block and flow diagrams described above may be combined or divided in any manner in software, hardware, or firmware.

Other variants or applications of the invention may be apparent to a person skilled in the art given the disclosure herein. The scope of the invention is not limited by the described embodiments, but only by the appendant claims.

What is claimed is:

1. An encoder stage for encoding an input signal comprising a plurality of different symbols, the encoder stage comprising:
   a variable length encoder for encoding the input signal; and
   a counter configured to dynamically detect a frequency at which the different symbols are found within each of a plurality of predetermined portions of the input signal, prior to the symbols of each respective portion being encoded by the variable length encoder;
   wherein the variable length encoder is configured to encode the symbols of each portion using variable length coding performed using a probability mass function (PMF) generated dynamically at the encoder in dependence on the frequencies detected dynamically by the counter within the respective portion of the input signal including the frequencies detected by the counter for symbols of the respective portion that have not yet been encoded, to generate an encoded bitstream comprising the encoded symbols along with an additional element indicating information regarding the frequencies detected by the counter for each portion, and to output the encoded bitstream to at least one of a storage medium and a transmission medium for supply to a decoder.

2. The encoder stage of claim 1, wherein the encoder is configured to encode the symbols of said portion without reference to any symbols already encoded by the variable length encoder.

3. The encoder stage of claim 1, wherein the variable length encoder is arranged to encode more frequent symbols of the input signal with codes having fewer bits, and to encode less frequent symbols of the input signal with codes having more bits; and
   wherein the variable length encoder is configured to map the different length codes to the symbols based on the frequencies detected within said portion of the input signal, and encode the symbols of said portion of the input signal using said mapping.

4. The encoder stage of claim 1, wherein the variable length encoder is configured to switch between (i) a first mode of operation in which the symbols of each portion are encoded in dependence on the frequencies detected for the respective portion, and (ii) a second mode of operation in which the variable length encoding is either non-adaptive or adapted based on previously encoded symbols.

5. The encoder stage of claim 4, wherein the variable length encoder is configured to determine whether to switch between said modes of operation once per number of said portions, in dependence on a relative efficiency metric of the modes for the respective number of portions.

6. The encoder stage of claim 5, wherein the variable length encoder is configured to determine whether to switch between said modes of operation once per portion, in dependence on a relative efficiency metric of the modes for the respective portion.

7. The encoder stage of claim 1, wherein the variable length encoder is configured to encode said information on the frequencies for inclusion in the output bitstream, based on a known constraint on a total number of the symbols detected within each portion.

8. The encoder stage of claim 1, wherein the variable length encoder is configured to encode said information on the frequencies for inclusion in the output bitstream, including predicting occurrences of less frequent symbols based on occurrences of more frequent symbols.

9. The encoder stage of claim 1, wherein the variable length encoder is configured to encode said information on the frequencies for inclusion in the output bitstream, using run-length coding.

10. The encoder stage of claim 1, wherein the variable length encoder is configured to encode said information on the frequencies for inclusion in the output bitstream, by differentially encoding the information of one portion relative to one of: the information of a preceding portion, and a global PMF.

11. The encoder stage of claim 1, wherein the input signal comprises a video signal, and each of a plurality of said portions is a video frame representing a different respective moment in time.

12. The encoder stage of claim 1, wherein the input is an audio signal, and each of a plurality of said portions is an audio frame.

13. The encoder stage of claim 12, wherein said audio frames are MPEG audio frames.

14. The encoder stage of claim 1, wherein the input signal comprises a speech signal, and each of a plurality of said portions is a speech frame representing a predetermined number of voice pitch periods.

15. The encoder stage of claim 1, wherein:
the counter is configured to update the frequencies for a portion of the input signal after encoding each of a plurality of successive ones of said symbols within the respective portion; and
the variable length encoder is configured to encode each successive symbol of the respective portion using variable length coding performed in dependence on the updated frequencies.

16. A decoder stage, comprising:
a variable length decoder for decoding a bitstream arranged into a plurality of portions, and each portion comprising a plurality of different encoded symbols and an additional element indicating information regarding a frequency with which the different symbols occur within the respective portion, the frequencies of the different symbols being detected in the respective portion by a counter prior to the respective portion being encoded,
wherein the symbols of each portion are encoded according to a variable length encoding scheme using a probability mass function (PMF) generated dynamically by an encoder and adapted in dependence on the frequencies of the different symbols within the respective portion; and wherein the variable length decoder is configured to decode the symbols of each portion in dependence on the received information regarding the frequencies, and to thereby generate an output signal for output to a user device, the received information including the PMF that is generated dynamically.

17. A method implemented by a computing device comprising:
receiving by an encoder stage of the computing device an input signal comprising a plurality of different symbols to encode for transmission to a decoder stage;
using a counter to dynamically detect a frequency with which the different symbols occur in each of a plurality of predetermined portions of the input signal, and prior to the symbols of each respective portion being encoded by the encoder stage;
encoding the symbols of each portion using variable length coding performed using a probability mass function (PMF) generated dynamically at the encoder stage in dependence on the frequencies detected dynamically by the counter within the respective portion of the input signal for each of the symbols of the respective portion of the input signal;
generating from the encoding an encoded bitstream comprising the encoded symbols along with an additional element indicating information regarding the frequencies detected for each portion; and
outputting the encoded bitstream to at least one of a storage medium and a transmission medium for supply to the decoder stage.

18. The method of claim 17, wherein the additional element indicating information regarding the frequencies comprises the probability mass function that is generated dynamically on a per frame basis.

19. The method of claim 17, wherein the encoding of the input signal relies upon a probability mass function calculated according to a detected number of occurrences of the different symbols within the respective portion of the input signal that is to be encoded in lieu of relying on upon a pre-trained probability mass function.

20. The method of claim 17, wherein the encoding comprises estimating the probability mass function (PMF) for each frame individually and encoding the symbol values within a particular frame using a corresponding PMF estimated for the particular frame.

* * * * *